United States Patent [19]

Matsumoto

[11] Patent Number: 5,559,598
[45] Date of Patent: Sep. 24, 1996

[54] APPARATUS FOR DETECTING MISALIGNMENT BETWEEN DIFFRACTION GRATINGS AND THE POSITION OF A DIFFRACTION GRATING BASED ON THE PHASES OR THE PHASE DIFFERENCE BETWEEN ELECTRICAL SIGNALS

[75] Inventor: Takahiro Matsumoto, Zama, Japan

[73] Assignee: Canon Kabushiki Kaisha, Tokyo, Japan

[21] Appl. No.: 326,962

[22] Filed: Oct. 21, 1994

[30] Foreign Application Priority Data

Oct. 26, 1993 [JP] Japan .................................. 5-290024
Sep. 29, 1994 [JP] Japan .................................. 6-259413

[51] Int. Cl.$^6$ ................................................... G01B 9/02
[52] U.S. Cl. ........................... 356/356; 356/349; 356/363
[58] Field of Search ................................ 356/349, 356, 356/363; 250/237 G

[56] References Cited

U.S. PATENT DOCUMENTS 4,710,026 12/1987 Magome et al. .................... 356/349
5,369,486 11/1994 Matsumoto et al. ................. 356/349

Primary Examiner—Samuel A. Turner
Assistant Examiner—Amanda Merlino
Attorney, Agent, or Firm—Fitzpatrick, Cella, Harper & Scinto

[57] ABSTRACT

A position detection apparatus for measuring the positions of a mask and a wafer, misalignment between the mask and the wafer, alignment of patterns on the wafer, or the like, includes a diffraction grating provided on the object, a light source for emitting light having a single frequency, an illuminating unit for projecting the light of the light source onto the diffraction grating, frequency modulators for performing frequency modulation of diffracted light beams from the diffraction grating, a combining unit for combining a first diffracted light beam subjected to the frequency modulation by one of the frequency modulaters, and a second diffracted light beam, having a diffraction order different from that of the first diffracted light beam, from the diffraction grating, photoelectric transducers for obtaining signals by detecting the light combined by the combining unit, and a signal processing system for detecting the position of the diffraction grating based on the phases of the signals.

9 Claims, 13 Drawing Sheets

APPARATUS FOR DETECTING MISALIGNMENT BETWEEN DIFFRACTION GRATINGS AND THE POSITION OF A DIFFRACTION GRATING BASED ON THE PHASES OR THE PHASE DIFFERENCE BETWEEN ELECTRICAL SIGNALS

BACKGROUND OF THE INVENTION

1. Field of the Invention

This invention relates to a misalignment detection apparatus. For example, in an exposure apparatus for manufacturing semiconductor devices, when sequentially exposing and transferring a fine electronic circuit pattern formed on each of at least two kinds or first objects, such as masks (reticles) or the like, onto a second object, such as a wafer or the like, the apparatus of the invention is suitable as an alignment apparatus for performing relative alignment between the mask and the ware, an apparatus for measuring alignment accuracy of a printed pattern on the wafer after printing the pattern on time mask (reticle) the wafer, or the like.

The present invention can also be widely applied to a position detection apparatus for detecting the position of an object by providing at least one diffraction grating on the object.

2. Description of the Related Art

A method of detecting misalignment of at least one diffraction grating by measuring the phase difference between two beat signals obtained by, causing diffracted light beams from two diffraction gratings to independently perform heterodyne interference has been proposed as a method of detecting misalignment of at least one diffraction grating with high accuracy.

In a misalignment detection apparatus shown in FIG. 1, a laser light beam from a laser 111 is divided into two light beams, which pass through ultrasonic modulators 114 and 118 before being incident upon a diffraction grating MP, comprising two diffraction gratings. Hence, wavefront aberration is produced in the light beams after passing through the ultrasonic modulators 114 and 118, and therefore the wavefronts of the light beams incident upon the diffraction grating MP are distorted. At that time, the phase of an interfered light beam produced from two diffracted light beams is determined by the position of the diffraction grating MP in the x direction and the mean value of phases of the light beam on respective regions cut by the two diffraction gratings. That is, when the position of a diffraction-grating mark with respect to a beam spot (optical system) changes, the phases of two beat signals, serving as misalignment detection signals, change. As a result, an error is produced, causing degradation in the reproducibility of measurement.

In order to reduce the error, the alignment accuracy of the mark (diffraction grating) must be increased. For that purpose, a high-precision alignment wafer stage, a high-resolution mark-position detection apparatus and the like are required, thereby causing an increase in the size of the entire system, and causing problems from the viewpoint of the production cost and the throughput of the entire system.

In addition, since the above-described measurement utilizes the interference of two beams, for example, it is difficult to adjust an optical system, comprising mirrors and the like, for providing a desired incident angle on the diffraction grating.

Furthermore, for example, in an exposure apparatus for manufacturing semiconductor devices, a misalignment detection apparatus having increased resolution is required as the degree of integration of obtained IC's (integrated circuits) increases.

A method of detecting misalignment of a diffraction grating, comprising two diffraction gratings, each serving as a pattern, from the phase difference between two beat signals obtained as a result of independent heterodyne interference of diffracted light beams from the two diffraction gratings has been proposed, for example, in U.S. Pat. No. 4,710,026. FIG. 1 is a schematic diagram of a misalignment detection apparatus in an exposure apparatus for manufacturing semiconductor devices described in the above-described patent application.

In FIG. 1, the laser light beam from the laser light source 111 enters a beam splitter 113 after passing through collimating lenses 124 and 126, and is divided into two light beams. The frequencies of the divided light beams are shifted by frequencies $\Delta f1$ and $\Delta f2$ by the ultrasonic modulators 114 and 118, respectively. The light beams are then reflected by mirrors 115 and 119 and mirrors 116 and 120, respectively, and are projected onto the diffraction grating MP on a wafer 102 from different directions.

As shown in FIG. 2, the diffraction grating MP comprises two diffraction gratings MPa and MPb, which are shifted by $\Delta x$ with respect to each other. The light beams are diffracted by these diffraction gratings in a direction perpendicular to the wafer 102. The diffracted light beams interfere with each other, and the obtained interfered light beam is incident upon a half-mirror 105 after passing through an objective lens 103 and a diaphragm 104. The light beam passing through the half-mirror 105 is incident upon a photoelectric transducer 106. The light beam reflected by the half-mirror 105 is incident upon an eyepiece 107, and is used for observing interference fringes.

Respective interfered light beams caused by light beams diffracted by the diffraction gratings MPa and MPb are detected by photoelectric transducers 106a and 106b, which constitute the photoelectric transducer 106, respectively. Since the frequencies of the two light beams incident upon the diffraction grating Mp slightly differ from each other, detection signals representing the interference light beams become sinusoidal beat signals whose frequency corresponds to the frequency difference therebetween.

The phases of the beat signals from the photoelectric transducers 106a and 106b are detected by a misalignment-detection control circuit 125, and the amount of misalignment $\Delta x$ is calculated from the phases of the beat signals and the phases of reference frequencies supplied to the ultrasonic modulators 114 and 118.

SUMMARY OF THE INVENTION

It is an object of the present invention to overcome the problems of the art discussed above.

It is a further object of the present invention to provide a method of detecting misalignment of at least one diffraction grating with increased accuracy.

It is still another aspect of the present invention to provide a misalignment detection apparatus having increased resolution.

It is yet another object or the present invention to provide a misalignment detection apparatus suitable for use in an exposure apparatus for manufacturing semiconductor devices in which light from a laser having a single frequency is projected onto at least one diffraction grating serving as a misalignment detection mark while suppressing wavefront aberration as much as possible, and in which ± n-order diffracted light beams from the diffraction grating are subjected to frequency modulation, heterodyne interference, and the frequency-modulated ± n-order diffracted light beams are subjected to heterodyne interference, and photoelectric conversion to generate electrical beat signals so that the position of the diffraction grating can be detected from phases of the beat signals to improve accuracy in detection of the diffraction grating and to increase the tolerance in alignment between the alignment mark and the optical system.

According to one aspect, the present invention which achieves one or more of these objectives relates to a position detection apparatus for detecting a position of an object. The apparatus comprises a diffraction grating provided on the object and a light source for emitting light having a single frequency. The apparatus further comprises illuminating means for projecting the light of the light source onto the diffraction grating so that the diffraction grating produces first and second diffracted light beams of different diffraction orders or of the same diffraction order but of different signs. The apparatus further includes a plurality of frequency modulators for performing frequency modulation of the first and second diffracted light beams from the diffraction grating. The apparatus also comprises combining means for combining the first diffracted light beam subjected to frequency modulation by one or the frequency modulators and the second diffracted light beam subjected to frequency modulation by one of the frequency modulators. The apparatus also includes photoelectric conversion means for converting the light combined by the combining means to electrical signals, and a signal processing system for detecting the position of the diffraction grating based on the phases of the electrical signals.

The first diffracted light beam can comprise a light beam whose frequency is increased by one the frequency modulators and a light beam whose frequency is reduced by another of the frequency modulators. Each of these beams is combined with a second diffracted light beam by the combining means to produce two combined light beams. The photoelectric conversion means in this embodiment individually converts the two combined light beams to two electrical signals. Also in this embodiment the signal processing system detects the position of the diffraction grating based on the phase difference between the two electrical signals. In one embodiment each of the plurality of frequency modulators comprises an acoustooptical element. In addition, the apparatus can further comprise an interference-fringe observing system for observing interference fringes generated by diffracted light beams having the same frequency and different diffraction orders produced by the diffraction grating.

According to another aspect, the present invention which achieves one or more of these objectives relates to a misalignment detection apparatus for detecting a misalignment between first and second diffraction grating. The apparatus comprises a light source for emitting light having a single frequency. The apparatus further comprises illuminating means for projecting the light of the light source onto the first and second diffraction gratings so that the first diffraction grating produces first and second diffracted light beams of different diffraction orders or of the same diffraction order but of different signs and the second diffraction grading produces third and fourth diffracted light beams of different diffraction orders or of the same diffraction order but of different signs. The apparatus further comprises a plurality of frequency modulators for performing frequency modulation of the first, second, third and fourth diffracted light beams from the first and second diffraction gratings. The apparatus also comprises a combined-light-forming optical system for forming a first combined light beam obtained by combining the first and second diffracted light beams each subjected to frequency modulation by one the frequency modulators. The system also forms a second combined light beam obtained by combining the third and fourth diffracted light beams each subjected to frequency modulation by another frequency modulator. The apparatus also includes photoelectric conversion means for individually converting the first and second combined light beams from the combined-light-forming optical system to two electrical signals. The apparatus also includes a signal processing system for detecting misalignment between the first diffraction grating and the second diffraction grating based on the phase difference between the two electrical signals from the first and second combined light beams.

In one embodiment, the first diffracted light beam and the second diffracted light beam comprise diffracted light beams having the same diffraction order and different signs, and the third diffracted light beam and the first diffracted light beam have the same diffraction order, while the fourth diffracted light beam and the second diffracted light beam have the same diffraction order.

In addition, each of the plurality of frequency modulators can comprise art acoustooptical element. Also, the apparatus can further comprise an interference-fringe observing system for observing interference fringes generated by diffracted light beams having the same frequency and different diffraction orders from the first and second diffraction gratings.

The foregoing and other objects, advantages and features of the present invention will become more apparent from the following description of the preferred embodiments taken in conjunction with the accompanying drawings.

DESCRIPTION OF THE PREFERRED EMBODIMENTS

Figure 1:
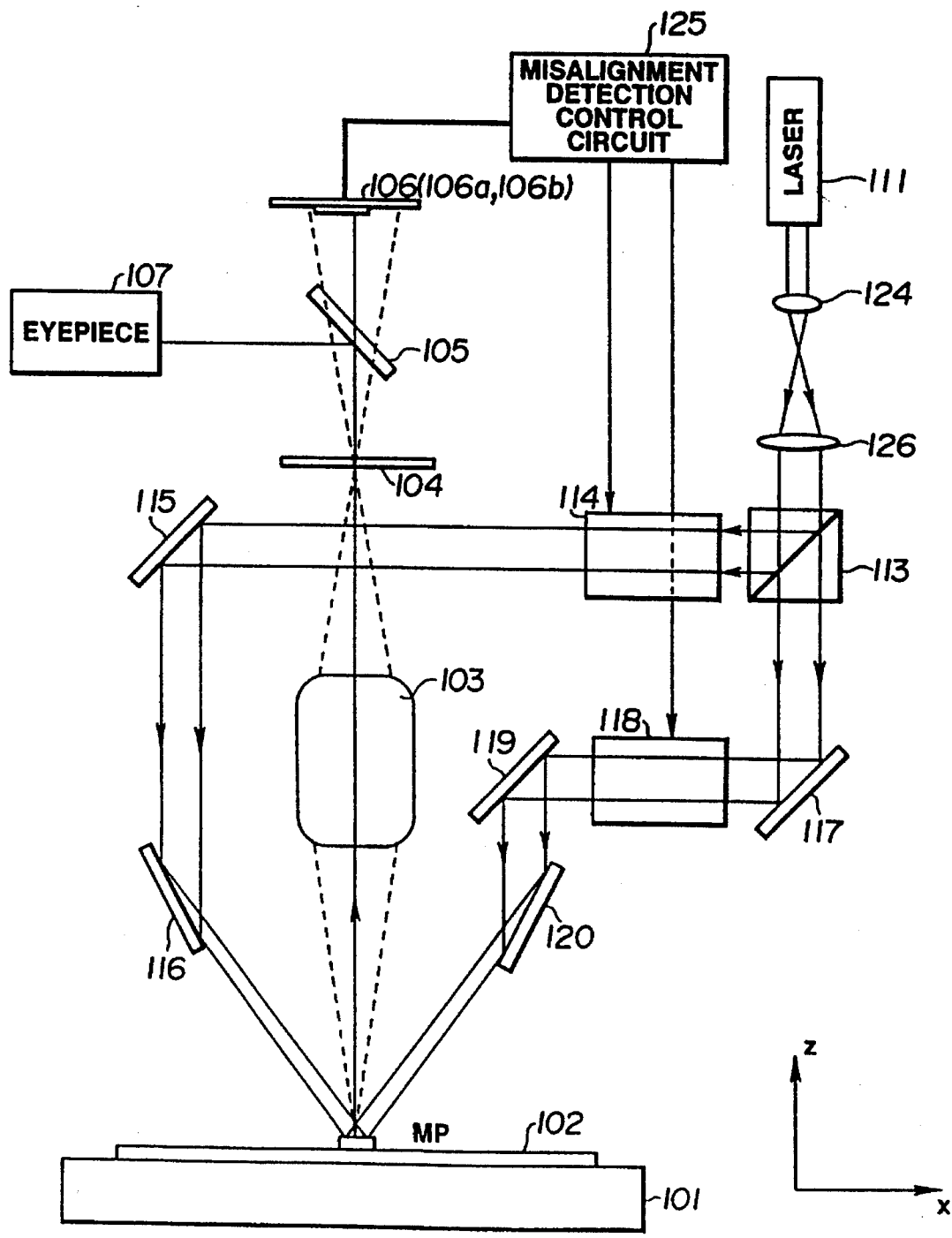
FIG. 1 is a schematic diagram illustrating a principal portion of a conventional misalignment detection apparatus.
Figure 2:
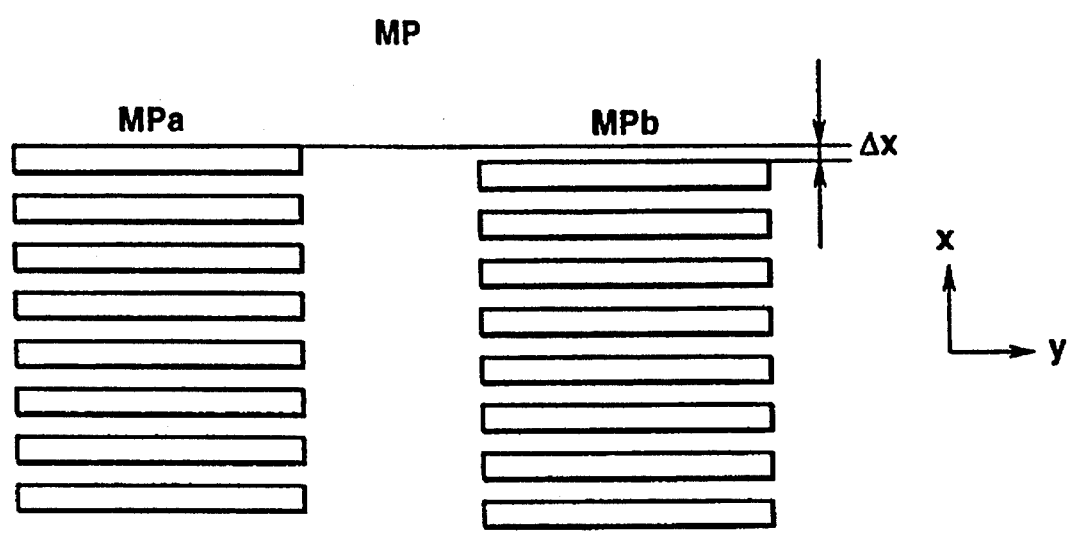
FIG. 2 is an enlarged view of a portion of FIG. 1.
Figure 3:
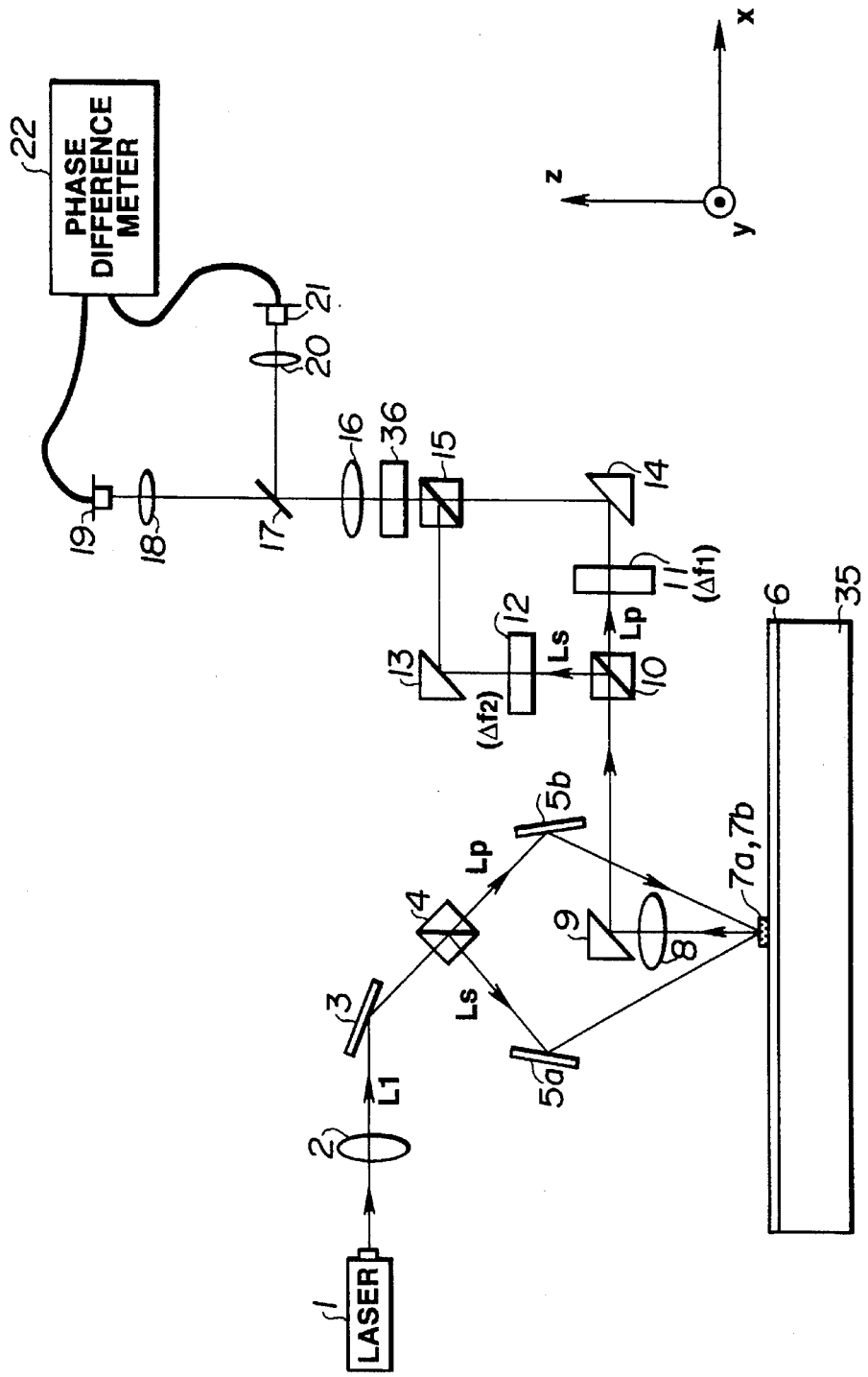
FIG. 3 is a schematic diagram illustrating a principal portion of an apparatus according to a first embodiment of the present invention.
Figure 4:
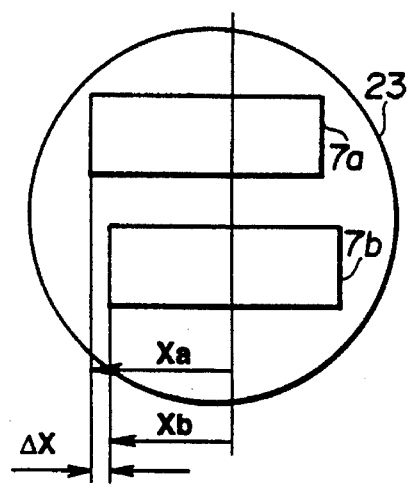
FIG. 4 is an enlarged schematic view illustrating a portion of FIG. 3.
Figure 5:
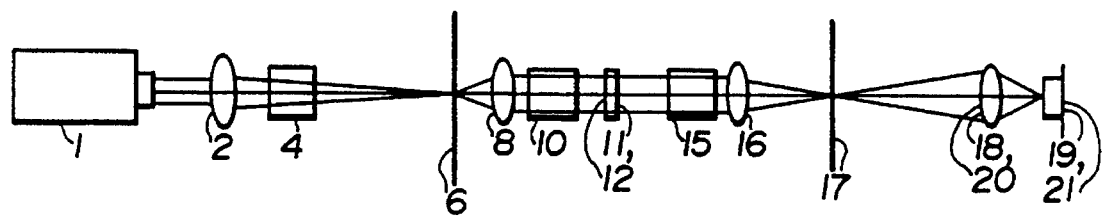
FIG. 5 is a schematic diagram in which an optical path shown in FIG. 3 is shown.
Figure 6:
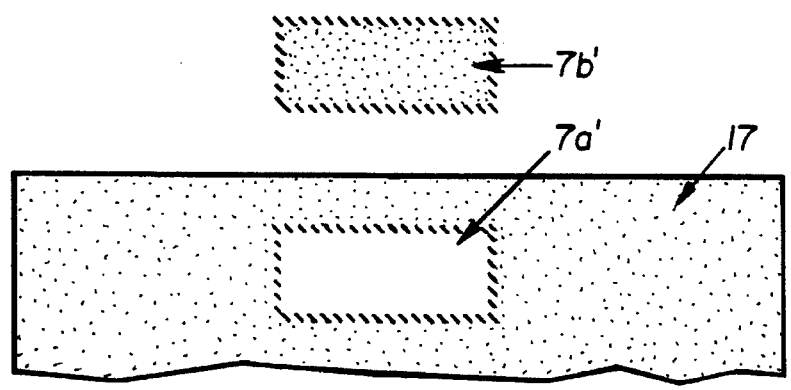
FIG. 6 is an enlarged schematic view illustrating another portion of the apparatus shown in FIG. 3.

FIG. 3 is a schematic diagram of a principal portion of an apparatus according to a first embodiment of the present invention. FIG. 3 illustrates a case of measuring alignment accuracy between patterns on two layers on the surface of a wafer in an exposure apparatus used in a process for manufacturing semiconductor devices. FIG. 4 is a diagram illustrating diffraction grating patterns and an incident light beam on the surface of the wafer shown in FIG. 3. FIG. 5 is a schematic diagram in which an optical path shown in FIG. 3 is shown. FIG. 6 is an enlarged view illustrating the neighborhood of an edge mirror shown in FIG. 3.

In FIG. 3, a light source 1 comprises a laser having a single frequency, such as a He—Ne laser, a collimated semiconductor conductor laser or the like. A collimating lens 2 makes the light beam from the light source 1 a parallel light beam. Reference numeral 3 represent a mirror reflecting the parallel light beam to a polarizing beam splitter 4 which divides the incident light beam into two light beams. There are also shown mirrors 5a and 5b. A diffraction grating pattern (a first diffraction grating) 7a is formed on a wafer 6 in an n-th semiconductor exposure process, and a diffraction grating pattern (a second diffraction grating) 7b is formed on the wafer 6 in an (n+1)-th semiconductor exposure process. A lens 8 is set so that its focal point is positioned on the surface of the wafer 6.

There are also shown a mirror 9, polarizing beam splitters 10 and 15, and mirrors 13 and 14. Each of acoustooptical elements 11 and 12 performs frequency modulation of a light beam incident thereon. Reference numeral 36 represents a Glan-Thompsom prism, and reference numeral 16 represents a lens. An edge mirror 17 is positioned at the focal point of the lens 16, and separates the incident light beam in two directions. There are also shown lenses 18 and 20, and sensors (first and second photoelectric transducers) 19 and 21. A phase-difference meter 22 obtains the phase difference between signals (beat signals) obtained from the sensors 19 and 21. A wafer stage 35 mounts the wafer 6.

In the present embodiment, the light beam L1 having a frequency f0 emitted from the single-frequency laser 1 becomes a parallel light beam by passing through the collimating lens 2, and is incident upon the polarizing beam splitter 4 via the mirror 3. The polarizing beam splitter 4 transmits the P-polarized light component Lp of the incident light beam L1, which is deflected by the mirror 5b and is projected onto the diffraction gratings 7a and 7b on the wafer 6. At that time, the mirror 5b is set so that a +1st-order diffracted light beam is subjected to reflection diffraction perpendicularly to the wafer 6.

On the other hand, the S-polarized light component Ls of the incident light L1 is reflected by the polarizing beam splitter 4, is then deflected by the mirror 5a, and is projected onto the diffraction gratings 7a and 7b. At, that time, the mirror 5a is set so that a −1st-order diffracted light beam is subjected to reflection diffraction perpendicularly to the wafer 6. The incident light beam L1 is condensed by the collimating lens 2 so as to provide a spot more or less of greater diameter than the two diffraction gratings 7a and 7b on the wafer 6 (a light beam 23 shown in FIG. 4).

The two polarized-light components separated by the polarizing beam splitter 4 are again combined by the diffraction gratings 7a and 7b, to pass through the same optical path. Since the lens 8 is set so that its focal point is present on the wafer 6, the combined diffracted light beam becomes a parallel light beam, which is deflected by the mirror 9, and enters the polarizing beam splitter 10. At that time, the P-polarized light beam Lp, serving as a first-order diffracted light beam, passes through the polarizing beam splitter 10, and enters the acoustooptical element 11. A signal having a frequency Δf1 is transmitted from a first oscillator (not shown) to the acoustooptical element 11, where the first-order diffracted light beam is subjected to frequency modulation by +Δf1 to produce a frequency f1 (w1). On the other hand, a −first-order S-polarized diffracted light beam Ls reflected by the polarizing beam splitter 10 enters the acoustooptical element 12, where the frequency of the−first-order diffracted light beam is shifted by the frequency Δf2 of a signal from a second oscillator (not shown) to produce a frequency f2 (w2). These diffracted light beams are again combined by the polarizing beam splitter 15 after being reflected by the mirrors 14 and 13, respectively. The orientations of polarization of the ± first-order diffracted light beams from the diffraction gratings 7a and 7b are aligned by the Glan-Thompsom prism 36. Then, the combined light beam passes through the lens 16. The edge mirror 17 is disposed at the focus position of the lens 16.

As shown in FIG. 5, the surface of the edge mirror 17 is conjugate with the wafer 6. Hence, as shown in FIG. 6, on the surface of the edge mirror 17, the images of the diffraction gratings 7a and 7b on the wafer 6 are observed as images 7a' and 7b'. Accordingly, the ± first-order diffracted light beams from the diffraction grating 7a are reflected by the edge mirror 17, and the ± first-order diffracted light beams from the diffraction gratings 7b are transmitted through the edge mirror 17.

The lenses 18 and 20, and the sensors 19 and 21 are disposed so that the sensors 19 and 21 are present at positions conjugate with the edge mirror 17 (and the wafer 6). Accordingly, the above-described two combined light beams are subjected to photoelectric conversion by the sensors 21 and 19, to produce beat signals caused by heterodyne interference. These two beat signals are guided to the phase-difference meter 22, where the phase difference between the two beat signals is detected.

In the present embodiment, as shown in FIGS. 3–6, when the positions of the two diffraction gratings, serving as misalignment detection marks, on the surface of the wafer 6 change with respect to the beam spot 23, the incident positions of the diffracted light beams on the acoustooptical elements 11 and 12 change little. This is because if the wafer 6 having the misalignment marks is assumed to be an object plane, the acoustooptical elements are present at or in the vicinity of the pupil planes. It is considered that each of the acoustooptical elements 11 and 12 has an inherent aberration, so that the phase of the first-order diffracted light beam from each of the elements differs. However, the offset due to the difference between characteristics of the two acoustooptical elements can be removed when the phase difference between the two beat signals is obtained. Hence, the phase difference between the two beat signals is not influenced by the positions of the marks.

A description will now be provided of the phase of the diffracted light beam and the phase of the beat signal.

The complex amplitude representation uar of the + first-order diffracted light beam of the P-polarized light component having a frequency f0 (an angular frequency w0) from the diffraction grating 7a is expressed as follows:

$$uar = u0 \exp\{i(w0 \cdot t + Txa + Tp)\} \quad (1),$$

where u0 is the amplitude of the light beam, and Txa is a phase change due to an amount of misalignment xa from a reference line of the optical system of the diffraction grating 7a in the x direction as seen in FIG. 4. If the pitch of the diffraction grating 7a is represented by p, $Txa = 2\pi xa/p$. Tp is the initial phase of the P-polarized light component.

On the other hand, the complex amplitude representation ual of the — first-order diffracted light beam of the S-polarized light component having a frequency f0 (an angular frequency w0) from the diffraction grating 7a is expressed as follows:

$$ual = u0 \exp\{i(w0 \cdot t - Txa + Ts)\} \quad (2),$$

where Ts is the initial phase of the S-polarized light component.

The complex amplitude representation ubr of the +first-order diffracted light beam of the P-polarized light component having a frequency f0 (an angular frequency w0) from the diffraction grating 7b is expressed as follows:

$$ubr = u0 \exp\{i(w0 \cdot t + Txb + Tp)\} \quad (3),$$

where u0 is the amplitude of the light beam, and Txb is a phase change due to an amount of misalignment xb from a reference line of the optical system of the diffraction grating 7b in the x direction as seen in FIG. 4. When the pitch of the diffraction grating 7b is represented by p, $Txb = 2\pi xb/p$.

On the other hand, the complex amplitude representation of the –first-order diffracted light beam of the S-polarized light component having a frequency f0 (an angular frequency w0) from the diffraction grating 7b is expressed as follows:

$$ubl = u0 \exp\{i(w0 \cdot t - Txb + Ts)\} \quad (4).$$

The complex amplitude representations of the diffracted light beams expressed by expressions (1) through (4) after being subjected to frequency modulation by the acoustooptical elements 11 and 12 are expressed as follows:

$$uar' = u0 \exp\{i(w1 \cdot t + Txa + Tp + T1)\} \quad (5)$$

$$ual' = u0 \exp\{i(w2 \cdot t - Txa + Ts + T2)\} \quad (6)$$

$$ubr' = u0 \exp\{i(w1 \cdot t + Txb + Tp + T1)\} \quad (7)$$

$$ubl' = u0 \exp\{i(w2 \cdot t - Txb + Ts + T2)\} \quad (8),$$

where $f1 = f0 + \Delta f1$ (an angular frequency w1), $f2 = f0 + \Delta f2$ (an angular frequency w2), and T1 and T2 are the amounts of phase changes caused by the aberrations of the acoustooptical elements 11 and 12.

The AC component Ia of the beat signal obtained from the sensor 21 after performing heterodyne interference of the light beams expressed by expressions (5) and (6) is expressed as follows:

$$Ia = I0 \cos\{(w1-w2)t + 2Txa + (Tp-Ts) + (T1-T2)\} \quad (9).$$

The AC component Ib of the beat signal obtained from the sensor 19 after performing heterodyne interference of the light beams expressed by expressions (7) and (8) is expressed as follows:

$$Ib = I0 \cos\{(w1-w2)t + 2Txb + (Tp-Ts) + (T1-T2)\} \quad (10).$$

In the expression of the phase difference $\Delta T$ between the beat signals expressed by expressions (9) and (10), the terms of the initial phase and the phase change due to the aberration disappear, and the phase difference $\Delta T$ is expressed by:

$$\Delta T = 2(Txa - Txb) = 2T\Delta x \quad (11).$$

$T\Delta x$ is the amount of phase change due to the amount of relative misalignment $\Delta x$, as seen in FIG. 4, between the diffraction gratings 7a and 7b in the x direction, and is expressed by:

$$T\Delta x = 4\pi\Delta x/p \quad (12).$$

Accordingly, the amount of relative misalignment $\Delta X$ between the diffraction gratings 7a and 7b, i.e., misalignment between the circuit pattern printed at the n-th exposure and the circuit pattern printed at the (n+1)-th exposure is obtained by the following expression:

$$\Delta x = \Delta T \cdot p/(4\pi) \quad (13).$$

Although in the present embodiment, a case of obtaining beat signals as a result or heterodyne interference between ± first-order diffracted light beams, diffracted light beams of other diffraction order may also be used. When utilizing the ± n-th-order diffracted light beams, the following relationship between the amount of misalignment $\Delta x$ and the phase difference $\Delta T$ is obtained, so that the sensitivity increases by n times:

$$\Delta x = \Delta T \cdot p/(4n\pi) \quad (14).$$

Errors produced due to the offset value of the detection optical system and the rotation component of the mark (diffraction grating pattern) with respect to the detection optical system can be removed, for example, by printing reference marks, comprising two diffraction gratings not deviating from each other, on the wafer simultaneously when printing the diffraction grating 7a, detecting the reference marks by the detection system in advance, and using detection values as correction values.

Although in the present embodiment, a description has been provided of the method of detecting misalignment only in the x direction, the amount of misalignment in the y direction may be measured in the same manner by printing diffraction gratings for detecting misalignment in the y direction, and setting another optical system for detecting misalignment in the y direction, or by detecting the phase difference while rotating the wafer stage 35 by 90 degrees from the state shown in FIG. 3.

Figure 7:
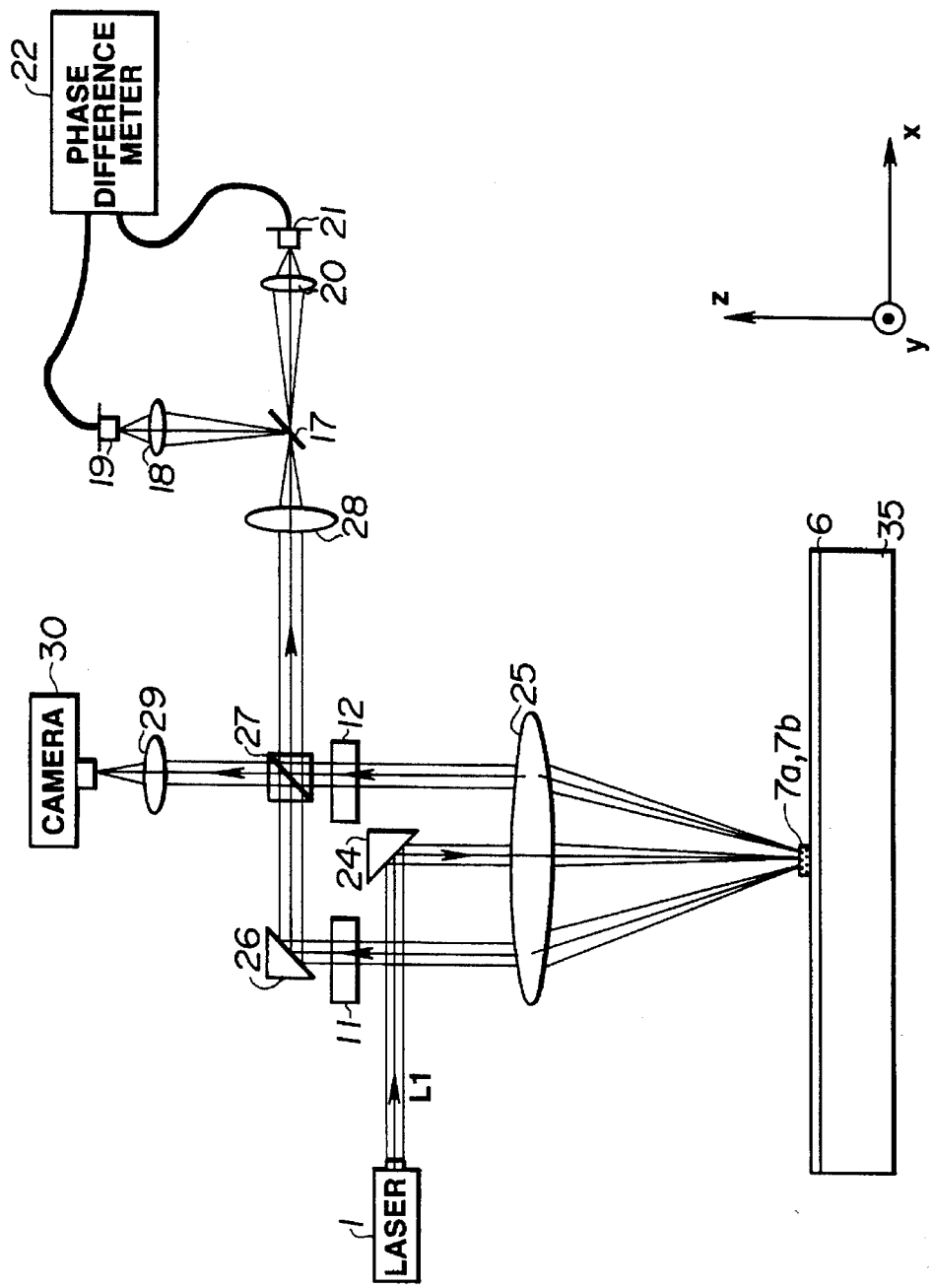
FIG. 7 is a schematic diagram illustrating a principal portion of an apparatus according to a second embodiment of the present invention.

FIG. 7 is a schematic diagram illustrating a principal portion of an apparatus according to a second embodiment of the present invention. As in the first embodiment, this embodiment illustrates a case of measuring alignment accuracy between patterns on two layers on the surface of a wafer in an exposure apparatus used in a process for manufacturing semiconductor devices. In FIG. 7, components having the same functions as in the first embodiment shown in FIG. 3 are indicated by the same reference numerals.

In FIG. 7, there are shown a single-frequency laser 1, and a mirror 24. A diffraction grating pattern 7a is formed on a wafer 6 in an n-th semiconductor exposure process, and a diffraction grating pattern 7b is formed on the wafer 6 in an (n+1)-th semiconductor exposure process. The wafer 6 is present on the focal planes of acoustooptical elements 11 and 12, and on the focal plane of a lens 25. There are also shown a mirror 26, a beam splitter 27, a lens 29, a CCD (charge-coupled device) camera 30, a lens 28, an edge mirror 17, lenses 18 and 20, sensors 19 and 21, a phase-difference meter 22, and a wafer stage 35.

In the present embodiment, the light beam L1 having a frequency f0 emitted from the single-frequency laser 1 is deflected by the mirror 24, passes through the lens 25, and is incident upon the wafer 6 perpendicularly thereto. Since the wafer 6 is present at the focus position of the lens 25, the ± first-order diffracted light beams from the diffraction gratings 7a and 7b become parallel light beams after passing through the lens 25. The frequency of the + first-order diffracted light beam is shifted by $\Delta f1$ by the acoustooptical element 11 to become $f0+\Delta f1$ (an angular frequency w1), and the frequency of the − first-order diffracted light beam is shifted by $\Delta f2$ by the acoustooptical element 12 to become $f0+\Delta f2$ (an angular frequency w2).

The two light beams are combined by the beam splitter 27 after the light beam passing through element 11 is reflected by mirror 26. One light beam from the beam splitter 27 passes through the lens 28, and is divided by the edge mirror 17, having the same configuration as in the first embodiment, into diffracted light beams from the diffraction gratings 7a and 7b, which are photoelectrically detected by the sensors 19 and 21, respectively, as heterydyne-interfered beat signals. Another light beam passing through the beam splitter 27 enters the CCD camera 30 via the lens 29, and is used for observing the images of the diffraction gratings.

The AC component Ia of the beat signal obtained from the sensor 21 is expressed by:

$$Ia=I0 \cos \{(w1-w2)t+2Txa+(T1-T2)\} \quad (15),$$

where I0 is the amplitude.

The AC component Tb of the beat signal obtained from the sensor 19 is expressed by:

$$Ib=I0 \cos \{(w1-w2)t+2Txb+(T1-T2)\} \quad (16).$$

In the expression of the phase difference $\Delta T$ between the beat signals expressed by expressions (15) and (16), the terms T1 and T2 of phase changes due to aberration disappear, and the phase difference $\Delta T$ is expressed by:

$$\Delta T=2(Txa-Txb)=2T\Delta x \quad (17).$$

$T\Delta x$ is the amount or phase change due to the amount of relative misalignment $\Delta X$ between the diffraction gratings 7a and 7b in the x direction, and is expressed by:

$$T\Delta x=4\pi\Delta x/p \quad (18).$$

Accordingly, the amount of relative misalignment $\Delta X$ between the diffraction gratings 7a and 7b, i.e., misalignment between the circuit pattern printed at the n-th exposure and the circuit pattern printed at the (n+1)-th exposure is obtained by the following expression:

$$\Delta x=\Delta T \cdot p/(4\pi) \quad (19).$$

Figure 8:
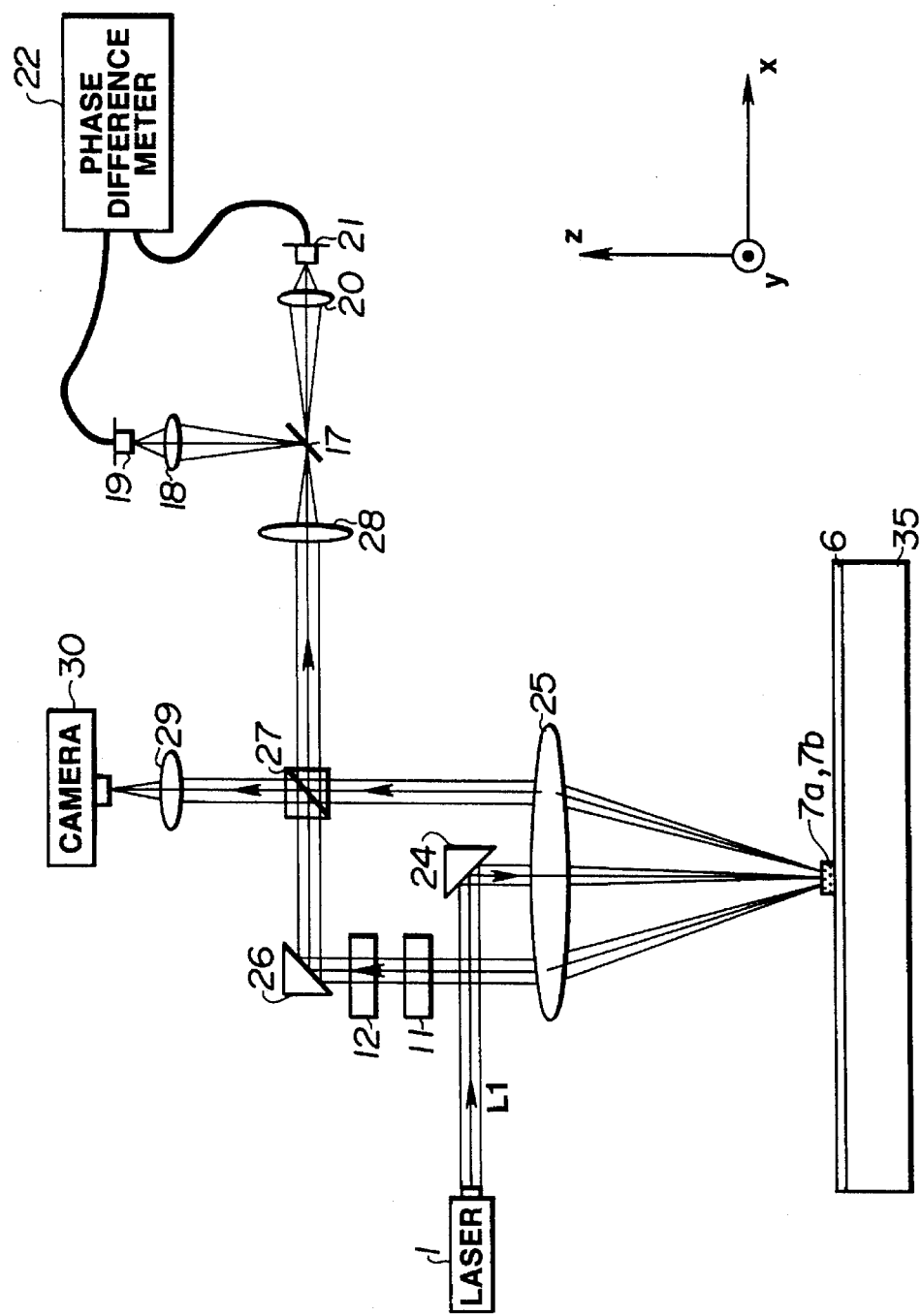
FIG. 8 is a schematic diagram illustrating a principal portion of an apparatus according to a third embodiment of the present invention.

FIG. 8 is a schematic diagram illustrating a principal portion of an apparatus according to a third embodiment of the present invention. As in the second embodiment, this embodiment illustrates a case of measuring alignment accuracy between patterns on two layers on the surface of a wafer in an exposure apparatus used in a process for manufacturing semiconductor devices. In FIG. 8, components having the same functions as in the second embodiment are indicated by the same reference numerals.

In FIG. 8, there are shown a single-frequency laser 1, and a mirror 24. A diffraction grating pattern 7a is formed on a wafer 6 in an n-th semiconductor exposure process, and a diffraction grating pattern 7b is formed on the wafer 6 in an (n+1)-th semiconductor exposure process. There are also shown acoustooptical elements 11 and 12, a lens 25, a mirror 26, a beam splitter 27, a lens 29, a CCD camera 30, a lens 28, an edge mirror 17, lenses 18 and 20, sensors 19 and 21, a phase-difference meter 22, and a wafer stage 35.

In the present embodiment, the light beam L1 having a frequency f0 (an angular frequency w0) emitted from the single-frequency laser 1 is deflected by the mirror 24, passes through the lens 25, and is incident upon the wafer 6 perpendicularly thereto. Since the wafer 6 is present at the focus position of the lens 25, the ± first-order diffracted light beams from the diffraction gratings 7a and 7b become parallel light beams after passing through the lens 25. The frequency of the + first-order diffracted light beam is shifted by $\Delta f1$ by the acoustooptical element 11, and is further shifted by $-\Delta f2$ by the acoustooptical element 12 by being diffracted in an order laving a sign different from the sign in the case of the acoustooptical element 11, to become $f0+\Delta f1-\Delta f2$ (an angular frequency w12).

This light beam and the − first-order diffracted light beam are combined by the beam splitter 27. One light beam from the beam splitter 27 passes through the lens 28, and is divided by the edge mirror 17, having the same configuration as in the first embodiment, into diffracted light beams from the diffraction gratings 7a and 7b, which are photoelectrically detected by the sensors 19 and 21, respectively, as heterydyne-interfered beat signals. Another light beam passing through the beam splitter 27 enters the CCD camera 30 via the lens 29, and is used for observing the images of the diffraction gratings.

The AC component Ia of the beat signal obtained from the sensor 21 is expressed by:

$$Ia=I0 \cos \{(w12-w0)t+2Txa+(T1+T2)\} \quad (20),$$

where I0 is the amplitude.

The AC component Tb of the beat signal obtained from the sensor 19 is expressed by:

$$Ib=I0 \cos \{(w12-w0)t+2Txb+(T1+T2)\} \quad (21).$$

In the expression of the phase difference $\Delta T$ between the beat signals expressed by expressions (20) and (21), the terms T1 and T2 of phase changes due to aberration disappear, and the phase change $\Delta T$ is expressed by:

$$\Delta T=2(Txa-Txb)=2T\Delta x \quad (22).$$

$T\Delta x$ is the phase difference due to the amount of relative misalignment between the diffraction gratings 7a and 7b in the x direction, and is expressed by:

$$T\Delta x=4\pi\Delta x/p \quad (23).$$

Accordingly, the amount of relative misalignment between the diffraction gratings 7a and 7b, i.e., misalignment between the circuit pattern printed at the n-th exposure and the circuit pattern printed at the (n+1)-th exposure is obtained by the following expression:

$$\Delta x = \Delta T \cdot p / (4\pi) \tag{24}$$

Figure 9:
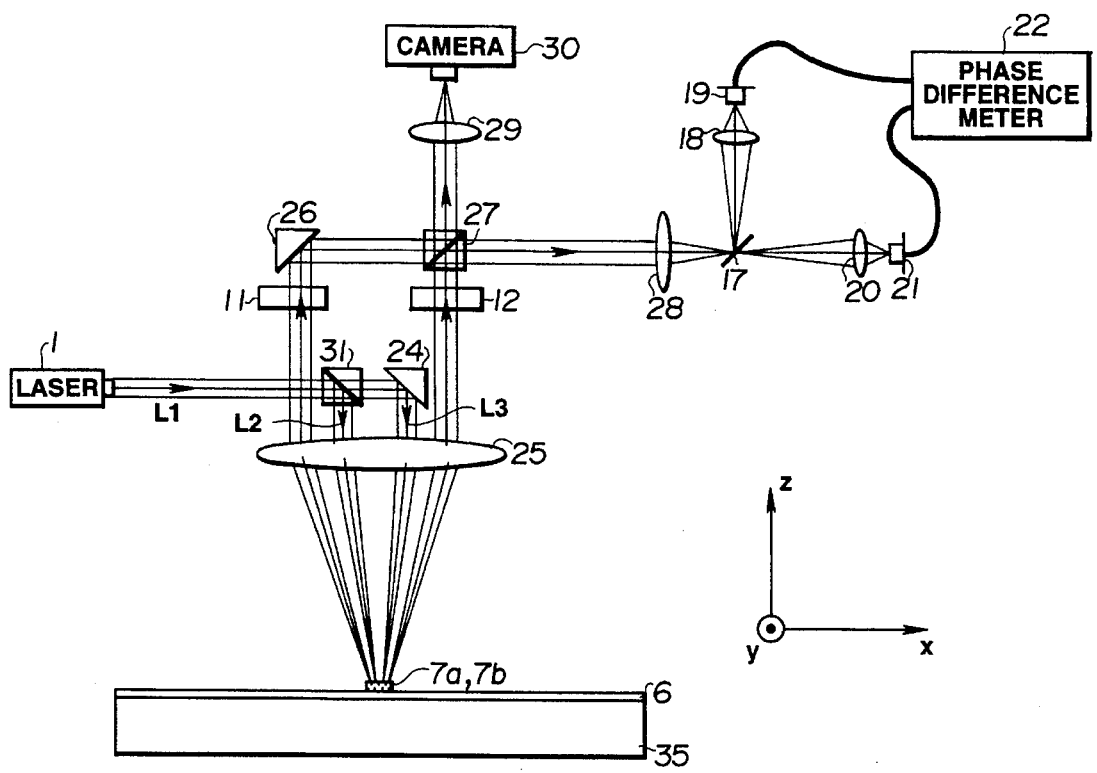
FIG. 9 is a schematic diagram illustrating a principal portion of an apparatus according to a fourth embodiment of the present invention.

FIG. 9 is a schematic diagram illustrating a principal portion of an apparatus according to a fourth embodiment of the present invention. The present embodiment illustrates a case of measuring alignment accuracy between patterns on two layers on the surface of a wafer in an exposure apparatus used in a process for manufacturing semiconductor devices. In FIG. 9, components having the same functions as in the third embodiment are indicated by the same reference numerals.

In FIG. 9, there are shown a single-frequency laser 1, a beam splitter 31, and a mirror 24. A diffraction grating pattern 7a is formed on a wafer 6 in an n-th semiconductor exposure process, and a diffraction grating pattern 7b is formed on the wafer 6 in an (n+1)-th semiconductor exposure process. There are also shown acoustooptical elements 11 and 12, a lens 25, a mirror 26, a beam splitter 27, a lens 29, a CCD camera 30, a lens 28, an edge mirror 17, lenses 18 and 20, sensors 19 and 21, a phase-difference meter 22, and a wafer stage 35.

In the present embodiment, the light beam L1 having a frequency f0 (an angular frequency w0) emitted from the single-frequency laser 1 is divided into two light beams L2 and L3 by the beam splitter 31. The reflected light beam L2 passes through the lens 25, and is incident upon the wafer 6 at a predetermined angle (incident angle α).

The light beam L3 transmitted through the beam splitter 31 is deflected by the mirror 24, and is incident upon the wafer 6 at an incident angle (−α) symmetrical to the angle α with respect to the z axis. Since the wafer 6 is present at the focus position of the lens 25, the ± first-order diffracted light beams from the diffraction gratings 7a and 7b become parallel light beams after passing through the lens 25. The frequency of the + first-order diffracted light beam of the incident light beam L3 deflected by the mirror 24 is shifted by Δf1 by the acoustooptical element 11 (a frequency f1 and an angular frequency w1). The frequency of the − first-order diffracted light beaux of the other incident light beam L2 is shifted by −Δf2 by the acoustooptical element 12 to become f0+Δf2 (a frequency f1 and an angular frequency w2).

These two light beams are combined by the beam splitter 27 after the light beam passing through element 11 is reflected by mirror 26. One light beam from the beam splitter 27 passes through the lens 28, and is divided by the edge mirror 17, as described in the first embodiment, into diffracted light beams from the diffraction gratings 7a and 7b, which are photoelectrically detected by the sensors 19 and 21 as heterydyne-interfered beat signals. Another light beam passing through the beam splitter 27 enters the CCD camera 30 via the lens 29, and is used for observing the images of the diffraction gratings.

The AC component Ia of the beat signal obtained from the sensor 21 is expressed by:

$$Ia = I0 \cos\{(w1-w2)t + 2Txa + (T1-T2)\} \tag{25}$$

where I0 is the amplitude.

The AC component Ib of the beat signal obtained from the sensor 19 is expressed by:

$$Ib = I0 \cos\{(w1-w2)t + 2Txb + (T1-T2)\} \tag{26}$$

In the expression of the phase difference ΔT between the beat signals expressed by expressions (25) and (26), the terms T1 and T2 of phase changes due to aberration disappear, and the phase difference ΔT is expressed by:

$$\Delta T = 2(Txa - Txb) = 2T\Delta x \tag{27}$$

TΔx is the amount of phase change due to the amount of relative misalignment between the diffraction gratings 7a and 7b in the x direction, and is expressed by:

$$T\Delta x = 4\pi \Delta x / p \tag{28}$$

Accordingly, the amount of relative misalignment between the diffraction gratings 7a and 7b, i.e., misalignment between the circuit pattern printed at the n-th exposure and the circuit pattern printed at the (n+1)-th exposure is obtained by the following expression:

$$\Delta x = \Delta T \cdot p / (4\pi) \tag{29}$$

Compared with the second and third embodiments, in this embodiment the NA (numerical aperture) of the lens 25 can be reduced, and the aberration can also be reduced.

Figure 10:
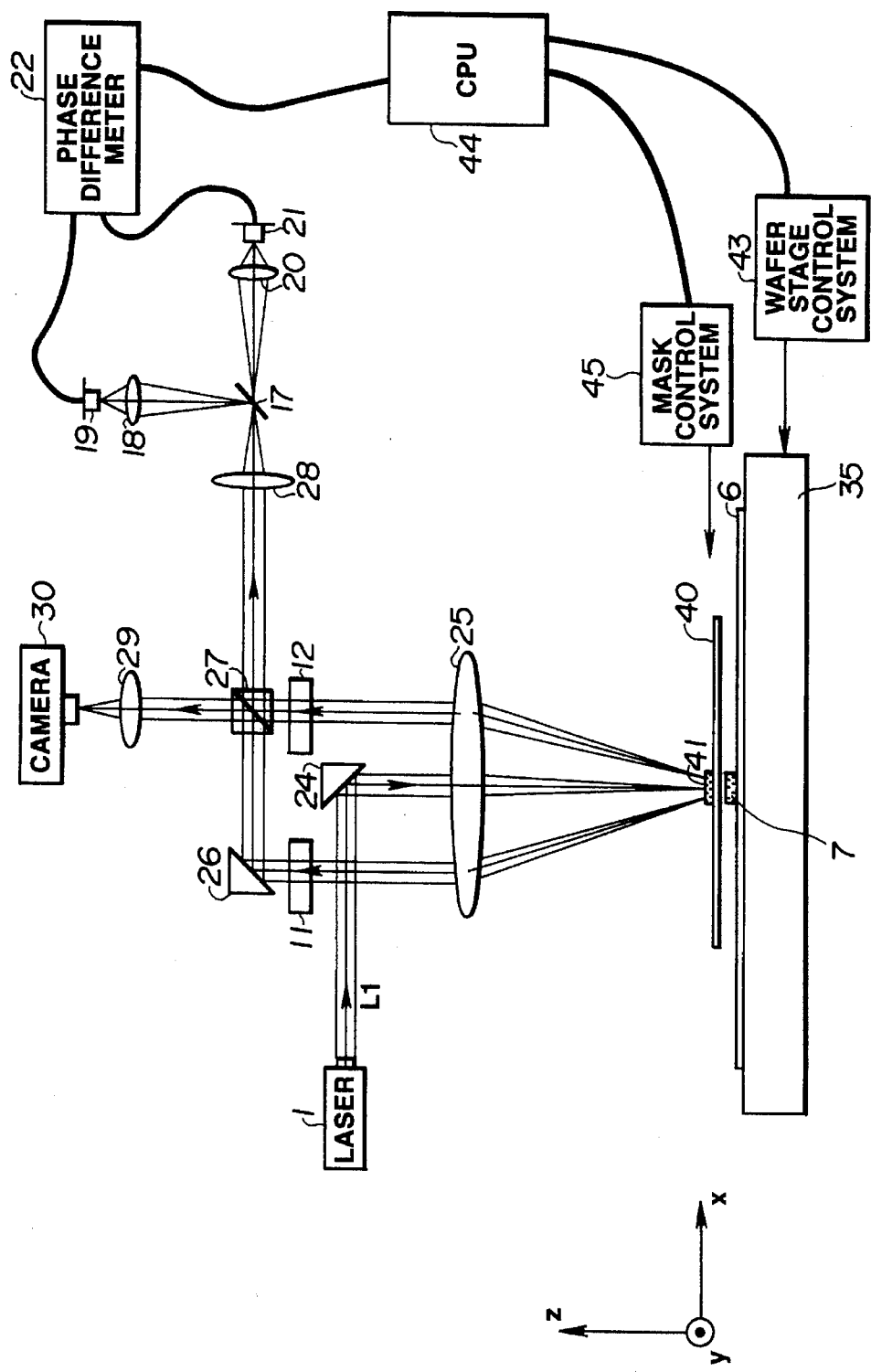
FIG. 10 is a schematic diagram illustrating a principal portion of an apparatus according to a fifth embodiment of the present invention.

FIG. 10 is a schematic diagram illustrating a principal portion of an apparatus according to a fifth embodiment of the present invention. The present embodiment illustrates a case in which the invention is applied to an exposure apparatus for manufacturing semiconductor devices using X-rays. In FIG. 10, components having the same functions as in the second embodiment shown in FIG. 7 are indicated by the same reference numerals.

Figure 11:
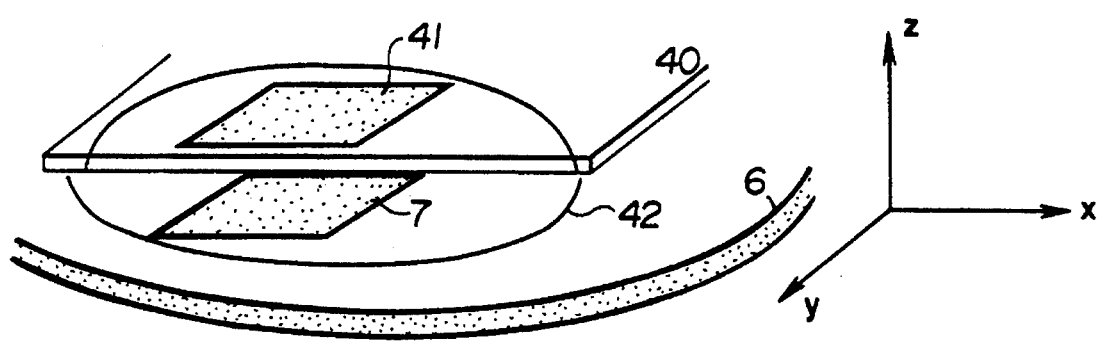
FIG. 11 is an enlarged schematic view illustrating a portion of FIG. 10.

FIG. 11 is a diagram illustrating the relationship among a diffraction grating 41, serving as an alignment mark, on a mask 40, a diffraction grating 7, serving as an alignment mark, on a wafer 6, and the spot 42 of an incident light beam. In the present embodiment, a gap of 10–30 μm is present between the mask 40 and the wafer 6 in the z direction, and the diffraction gratings 41 and 7 are shifted by a small amount in the y direction and therefore are not superposed.

In FIG. 10, there are shown a single-frequency laser 1, and a mirror 24. Reference numeral 41 represents a reflection diffraction grating on the mask 40, and reference numeral 7 represents a diffraction grating formed on the wafer 6. There are also shown acoustooptical elements 11 and 12, a lens 25, a mirror 26, a beam splitter 27, a lens 29, a CCD camera 30, a lens 28, an edge mirror 17, lenses 18 and 20, sensors 19 and 21, a phase-difference meter 22, a wafer stage 35, a mask control system 45, a wafer-stage control system 43, and a central signal processing/control unit 44.

In the present embodiment, the light beam having a frequency f0 emitted from the single-frequency laser 1 is deflected by the mirror 24, passes through the lens 25 and is incident upon the mask 40 and the wafer 6 perpendicularly thereto. Since the mask 40 and the wafer, 6 are present in the vicinity of the focus position of the lens 25, the ± first-order diffracted light beams from the diffraction gratings 41 and 7 become parallel light beams after passing the lens 25. The frequency of the + first-order diffracted light beam is shifted by Δf1 by the acoustooptical element 11 to become f0 + Δf1 (an angular frequency w1). The frequency of the − first-order diffracted light beam is shifted by Δf2 by the acoustooptical element 12 to become f0 + Δf2 (an angular frequency w2).

The two light beams are combined by the beam splitter 27 after the light passing through the element 11 is reflected by the mirror 26. One light beam from the beam splitter 27 passes through the lens 28, and is divided by the edge mirror 17, as described in the first embodiment, into diffracted light beams from the diffraction gratings 41 and 7, which are photoelectrically detected by the sensors 19 and 21 as heterodyne-interfered beat signals. Another light beam passing through the beam splitter 27 enters the CCD camera 30 via the lens 29, and is used for observing the images of the diffraction gratings.

The AC component Ia of the beat signal obtained from the sensor 21 is expressed by:

$$Ia=I0 \cos\{(w1-w2)t+2TxM+(T1-T2)\} \quad (30),$$

where I0 is the amplitude.

The AC component Tb of the beat signal obtained from the sensor 19 is expressed by:

$$Ib=I0 \cos\{(w1-w2)t+2TxW+(T1-T2)\} \quad (31).$$

In these expressions, TxM and TxW are the amounts of phase changes due to the amounts or deviation xM and xW of the diffraction gratings 41 and 7 from a reference line of the optical system, respectively. If the pitch of the diffraction gratings is represented by p, TxM=4πxM/p, and TxW=4πxW/p.

In the expression of the phase difference T between the beat signals expressed by expressions (30) and (31), the terms T1 and T2 of phase changes due to aberration disappear, and the phase difference ΔT is expressed by:

$$\Delta T=2(TxM-TxW)=2T\Delta x \quad (32).$$

TΔx is the amount of phase change due to the amount of relative misalignment between the diffraction gratings 41 and 7 in the x direction, and is expressed by:

$$T\Delta x=4\pi x/p \quad (33).$$

Accordingly, the amount of relative misalignment between the diffraction gratings 41 and 7, i.e., misalignment between the mask and the wafer obtained by the following expression:

$$\Delta x=\Delta T \cdot p/(4\pi) \quad (34).$$

Alignment between the mask arid the wafer is performed by transmitting driving commands corresponding to the amount Δx from the central signal processing/control unit 44 to the mask control system 45 and the wafer-stage control system 43.

In the conventional approach, in order to remove errors produced by the aberrations of acoustooptical elements, a mask (or a wafer) must be very precisely aligned with respect to the alignment optical system. According to the present method, however, allowance in the alignment of a mask and a wafer with respect to the alignment optical system increases.

Although in the foregoing embodiments, a description has been provided illustrating an exposure apparatus having unit magnification in which a mask is present in the vicinity of a wafer, the present invention may also be applied to a reduction projection exposure apparatus.

Figure 12:
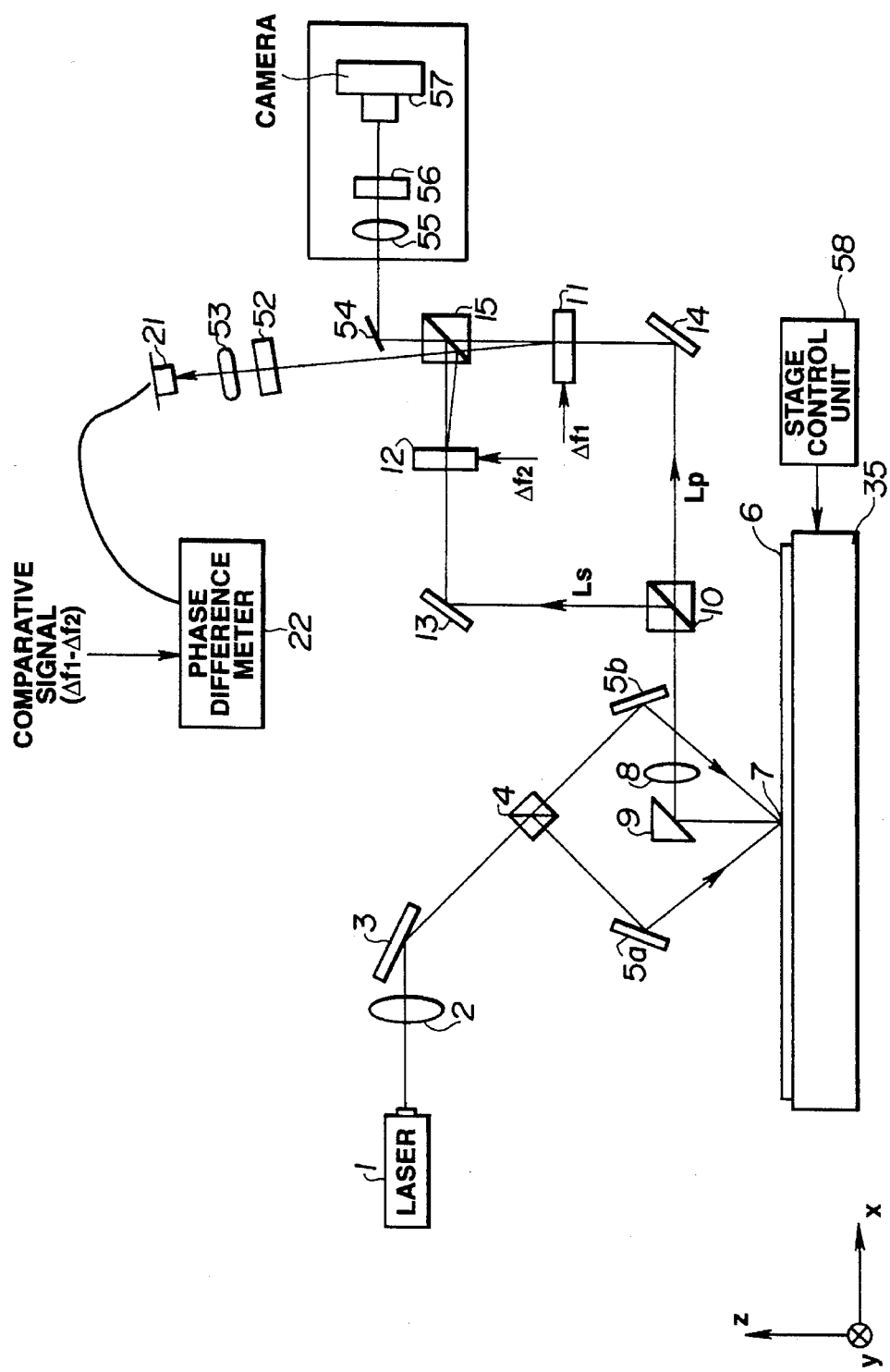
FIG. 12 is a schematic diagram illustrating a wafer alignment unit of a semiconductor exposure apparatus according to a sixth embodiment of the present invention.

FIG. 12 is a schematic diagram illustrating a wafer alignment unit for detecting misalignment between the main body of the apparatus and a wafer in a semiconductor exposure apparatus, according to a sixth embodiment of the present invention.

In FIG. 12, there are shown a single-frequency laser 1, a collimating lens 2, a mirror 3, a polarizing beam splitter 4, and mirrors 5a and 5b. A diffraction grating pattern 7, serving as an alignment mark, is formed on a wafer 6 by a semiconductor exposure process. There are also shown a mirror 9, a lens 8, polarizing beam splitters 10 and 15, acoustooptical elements 11 and 12, mirrors 13 and 14, Glan-Thompsom prisms 52 and 56, lenses 53 and 55, a sensor 21, a phase-difference meter 22, a CCD camera 57, a wafer stage 35, and a stage control unit 58.

The light beam having a frequency f0 emitted from the single-frequency laser 1 passes through the collimating lens 2, is reflected by the mirror 3 and is incident upon the polarizing beam splitter 4. The polarizing beam splitter 4 transmits the P-polarized light component of the incident light beam, which is deflected by the mirror 5b and is projected onto the diffraction grating 7 on the wafer 6. At that time, the mirror 5b is set so that a + 1st-order diffracted light beam is diffracted perpendicularly to the wafer 6.

Figure 15:
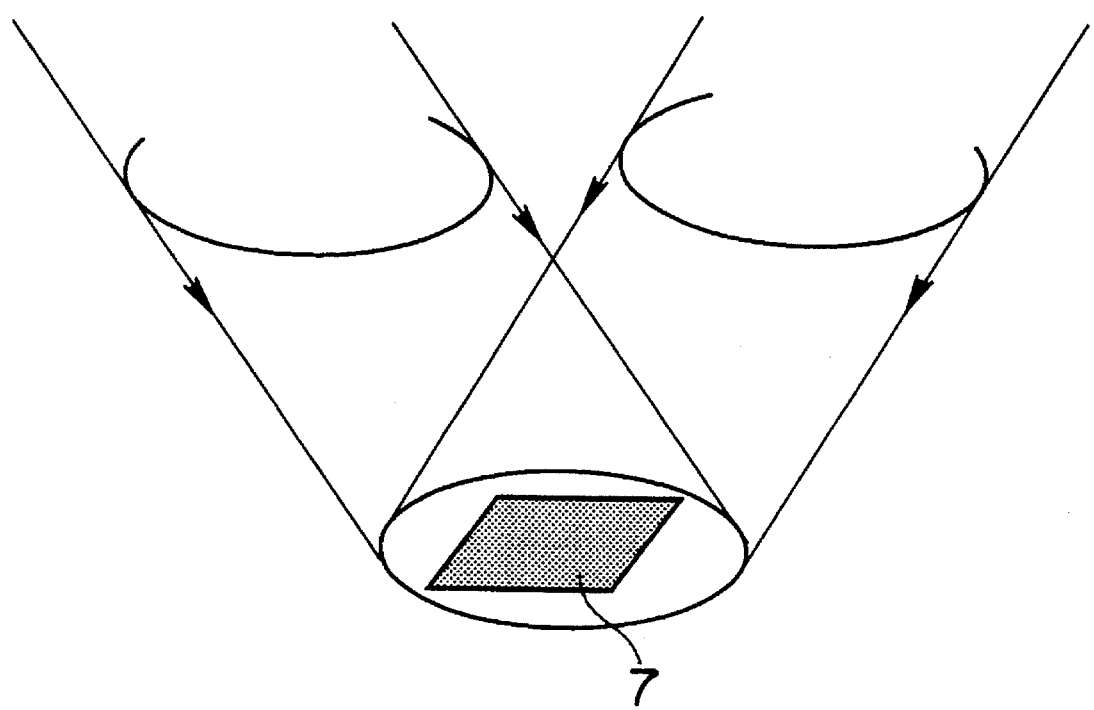
FIG. 15 is a diagram illustrating the relationship between a diffraction grating and an incident beam spot on a wafer in the sixth and seventh embodiments.

On the other hand, the S-polarized light component Ls of the light beam emitted from the laser 1 is reflected by the polarizing beam splitter 4, is then deflected by the mirror 5a, and is projected onto the diffraction grating 7. At that time, the mirror 5a is set so that a − 1st-order diffracted light beam is diffracted perpendicularly to the wafer 6. As shown in FIG. 15, the incident light beam is condensed by the collimating lens 2 so as to provide a spot more or less greater in diameter than the diffraction grating 7 on the wafer 6.

The two polarized-light components separated by the polarizing beam splitter 4 are again combined by the diffraction grating 7, to pass through the same optical path. Since the lens 8 is set so that its focal point is present on the wafer 6, the combined light beam becomes a parallel light beam, which enters the polarizing beam splitter 10 after being reflected by the mirror 9 and after passing through the lens 8. At that time, the P-polarized light beam, serving as a first-order diffracted light beam, passes through the polarizing beam splitter 10, and enters the acoustooptical element 11 after being reflected by mirror 14.

A signal having a frequency Δf1 is transmitted from an oscillator (not shown) to the acoustooptical element 11, where the first-order diffracted light beam is subjected to frequency modulation by + Δf1 to produce a frequency f1 (w1). On the other hand, a − first-order S-polarized diffracted light beam Ls reflected by the polarizing beam splitter 10 enters the acoustooptical element 12 after being reflected by the mirror 13, where the frequency of the − first-order diffracted light beam is shifted by the frequency Δf2 by a signal from a second oscillator (not shown) to produce a frequency f2 (w2). These diffracted light beams are again combined by the polarizing beam splitter 15. The orientations of polarization of the ± first-order diffracted light beams from the diffraction grating 7 are aligned by the Glan-Thompsom prism 52. Then, the combined light beam passes through the lens 53. The sensor 21 is disposed at the focus position of the lens 53 to receive the combined light beam.

The above-described combined light beam is subjected to photoelectric conversion by the sensor 21, to produce a heterodyne beat signal. This beat signal and a reference signal having a frequency equal to the difference (Δf1−Δf2) between the frequencies of the above-described two oscillators are guided to the phase-difference meter 22, where the phase difference between the two signals is detected.

A description will now be provided of the phase of the diffracted light beam and the phase of the beat, signal.

The complex amplitude representation uar of the + first-order diffracted light beam of the P-polarized light component having a frequency f0 (an angular frequency w0) from the diffraction grating 7 is expressed as follows:

$$uar=u0 \exp\{i(w0 \cdot t+Tx+Tp)\} \quad (35),$$

where u0 is the amplitude of the light beam, and Tx is the amount of a phase change due to an amount of misalignment x from a reference line of the optical system of the diffraction grating 7a in the x direction. If the pitch of the diffraction grating 7 is represented by p, $Tx=2\pi x/p$. Tp is the initial phase of the P-polarized light component.

On the other hand, the complex amplitude representation ual of the − first-order diffracted light beam of the S-polarized light component having a frequency f0 (an angular frequency w0) from the diffraction grating 7 is expressed as follows:

$$ual = u0\ \exp\{i(w0 \cdot t - Tx + Ts)\} \tag{36}$$

where Ts is the initial phase of the S-polarized light component.

The complex amplitude representations of the diffracted light beams expressed by expressions (35) and (36) after being subjected to frequency modulation by the acoustooptical elements 11 and 12 are expressed as follows:

$$uar' = u0\ \exp\{i(w1 \cdot t + Tx + Tp)\} \tag{37}$$

$$ual' = u0\ \exp\{i(w2 \cdot t - Tx + Ts)\} \tag{38}$$

The AC component I of the heal signal obtained from the sensor 21 after performing heterodyne interference of the light beams expressed by expressions (37) and (38) is expressed as follows:

$$I = I0\ \cos\{(w1-w2)t + 2Tx + (Tp-Ts)\} = I0\ \cos\{2\pi(f1-f2)t + 2Tx + Tp - Ts)\} \tag{39}$$

where I0 is the amplitude.

Accordingly, the phase difference ΔT which can be detected by the phase-difference meter 22 is expressed by:

$$\Delta T = 2Tx + T0 = 4\pi x/p + T0, \tag{40}$$

where T0 is the amount or offset.

From expression (40), the amount of misalignment of the wafer can be obtained from the phase difference.

The offset T0 can be removed, for example, by using the alignment-accuracy measuring apparatus shown in the first embodiment.

In the present embodiment, interference fringes can be observed by the CCD camera 57 by causing light beams passing through the acoustooptical elements 11 and 12 of the ± first-order diffracted light beams from the diffraction grating 7 to interfere with each other. Since the frequency of the light beams passing through the acoustooptical elements 11 and 12 remains f0, still interference fringes can be observed. It is possible to adjust the optical system, particularly, the mirrors 5a, 5b, 13 and 14, or the polarizing beam splitters 4, 10 and 15, while watching the interference fringes.

Figure 13A:
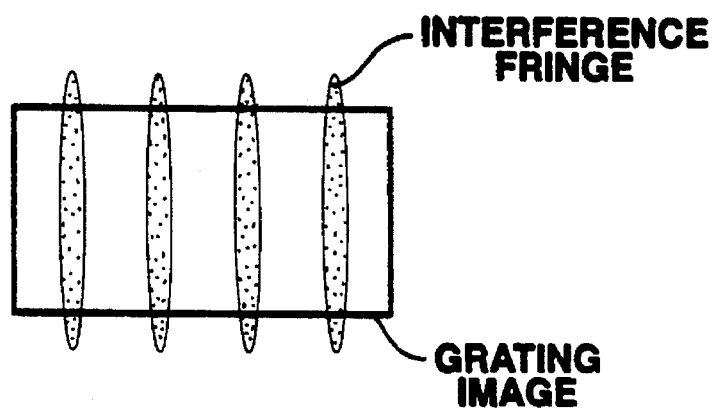
FIG. 13a–13c are diagrams illustrating interference fringes produced when adjusting an optical system in the sixth embodiment.
Figure 13B:
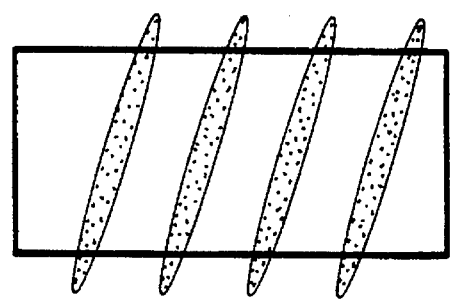
Figure 13C:
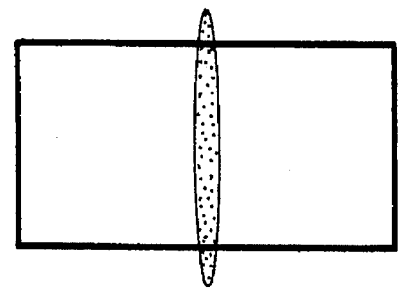

FIGS. 13(a) through 13(c) illustrate interference fringes observed during such an adjustment. FIG. 13(a) illustrates a case in which the mirrors 5a and 5b are improperly set, so that the incident angle on the diffraction grating is improper, and the directions of the ± first-order diffracted light beams deviate within the x-z plane. In this case, the amplitude of the beat signals is reduced, thereby causing an inferior S/N ratio. FIG. 13(b) illustrates a case in which the direction of arrangement of grids of the diffraction grating and the incident direction deviate also in the Wz direction. While watching the interference fringes, adjustment may be performed so that at least one interference fringe is obtained as shown in FIG. 13(c), and the direction of the interference fringe coincides with the direction of the grids. The amount of deviation and the crossing angle of light beams after combining the light beams subjected to frequency modulation with the acoustooptical elements 11 and 12 by the polarizing beam splitter will now be considered. The separation angle θ between the light beams transmitted through the acoustooptical elements 11 and 12 and the first-order modulated light beams is expressed by:

$$\theta = \lambda fs/2v \tag{41}$$

where λ is the wavelength of the light beams, fs is the frequency of the ultrasonic wave applied by elements 11 and 12, and v is the velocity of the ultrasonic wave.

Usually, the separation angle θ is 10–20 mrad. If the frequency Δf1 supplied to the acoustooptical element 11 is 90.1 MHz, and the frequency Δf2 supplied to the acoustooptical element 12 is 90 MHz, the difference between the separation angles of the acoustooptical elements 11 and 12 is 0.011–0.012 mrad. This value equals the crossing angle after combining the light beams by the polarizing beam splitter 15. If the distance between the polarizing beam splitter 15 and the sensor 21 is 100 mm, the amount of deviation of the light beams is about 2 μm, which is a small value. Accordingly, by adjusting the optical system utilizing light beams transmitted through the acoustooptical elements, the two light beams subjected to frequency modulation for forming the beat signal can be simultaneously adjusted.

Although in the present embodiment, a description has been provided of the detection of misalignment in the x direction, misalignment in the y direction may also be detected by a system obtained by rotating the above-described optical system by 90 degrees while forming marks rotated by 90 degrees on a wafer.

Figure 14:
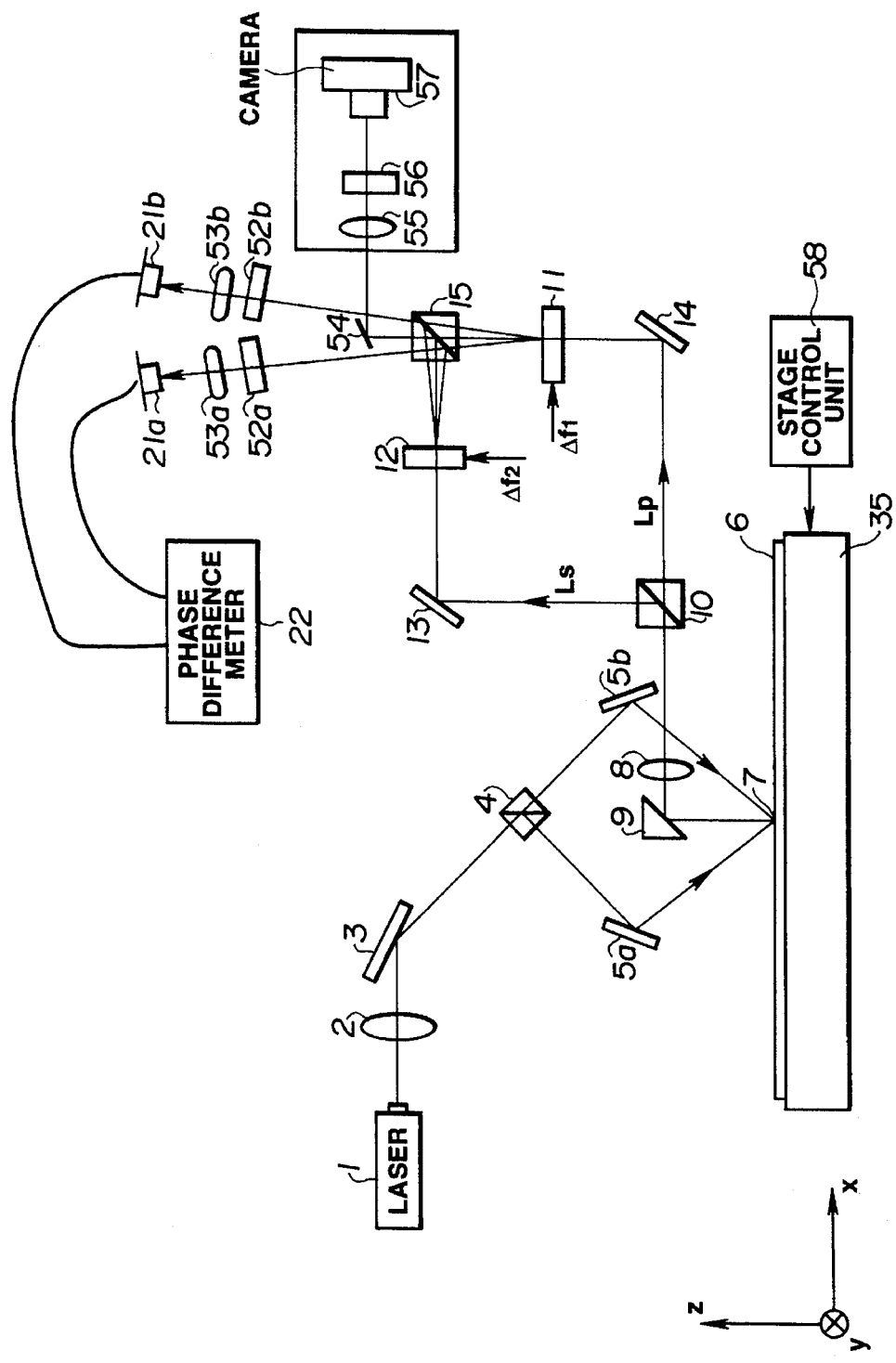
FIG. 14 is a schematic diagram illustrating a wafer alignment unit of a semiconductor exposure apparatus according to a seventh embodiment of the present invention.

FIG. 14 is a schematic diagram illustrating a wafer alignment unit for detecting misalignment between the main body of the apparatus and a wafer in a semiconductor exposure apparatus, according to a seventh embodiment of the present invention. The same reference numerals as those used in FIG. 12 denote identical elements. This embodiment is similar to the FIG. 12 embodiment, except that Glan-Thompson prism 52 is replaced by Glan-Thompson prisms 52a and 52b, lens 53 is replaced by lenses 53a and 53b, and sensor 21 is replaced by sensors 21a and 21b.

In the present embodiment, misalignment measuring resolution having a value twice the resolution value of the sixth embodiment is achieved.

In the sixth embodiment, the phase difference between a reference signal (comparative signal), which does not depend on the misalignment of a wafer, and a beat signal, obtained by modulating ± first-order diffracted light beams from a diffraction grating on the wafer and causing the resultant light beams to interfere with each other, is measured. In the present embodiment, however, ± first-order diffracted light beams from a wafer are subjected to frequency modulation, two beat signals, whose phases change in a direction opposite to the direction of the misalignment of the wafer, are formed, and the phase difference between the two beat signals is measured.

The beat signal detected by the sensor 21a shown in FIG. 14 is the same as the signal detected by the sensor 21 in the preceding embodiment. From expression (39), the following expression is obtained:

$$I1 = I0\ \cos\{2\pi(\Delta f1 - \Delta f2)t + 2Tx + (Tp-Ts)\} \tag{42}$$

When the light beam enters the acoustooptical element 11, a light beam subjected to a frequency modulation of − Δf1 also emanates in a direction symmetrical to a light beam subjected to frequency modulation of Δf1 with respect to the transmitted light beam. Similarly, when the light beam enters the acoustooptical element 12, a light beam subjected to a frequency modulation of $-\Delta f2$ also emanates in a direction symmetrical to a light beam subjected to frequency modulation of $\Delta f2$ with respect to the transmitted light beam.

If $f1=f0-\Delta f1$ (an angular frequency w1), and $f2=f0-\Delta f2$ (an angular frequency w2), the complex amplitude representation after performing frequency modulation of the diffracted light beams by $-\Delta f1$ and $-\Delta f2$ with the acoustooptical elements 11 and 12 is expressed by:

$$up=u0 \exp[i\{2\pi(f0-\Delta f1)t+Tx+Tp\}] \quad (43),$$

$$us=u0 \exp[i\{2\pi(f0-\Delta f2)t-Tx+Ts\}] \quad (44).$$

The beat signal obtained from the sensor 21b after combining the two light beams is expressed by:

$$I2=I0 \cos\{2\pi(\Delta f1-\Delta f2)t-2Tx+(Ts-Tp)\} \quad (45).$$

The phase difference $\Delta\phi$ between the beat signals represented by expressions (42) and (45) is expressed by:

$$\Delta\phi=4Tx+2(Tp-Ts)=8\pi x/p+2(Tp-Ts) \quad (46).$$

The amount of misalignment of the wafer is obtained from the phase difference using expression (46). In expression (46), a phase change has a sensitivity for the misalignment x of the wafer which is twice that of the case of expression (40), so that a twofold resolution increase can be achieved when using the same phase-difference meter (for example, a lock-in amplifier). If it is desired to further improve resolution, a known method of improving resolution, such as increasing the number of diffraction operations from a diffraction grating, or using diffraction light beams having a large diffraction order, may also be adopted.

The offset $2(Tp-Ts)$ can be removed, for example, by using the alignment-accuracy measuring apparatus shown in the first embodiment.

The individual components shown in outline or designated by blocks in the drawings are all well known in the position detection apparatus arts and their specific construction and operation are not critical to the operation or the best mode for carrying out the invention.

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent, structures and functions.

What is claimed is:

1. A position detection apparatus for detecting a position of an object, said apparatus comprising:

a diffraction grating provided on the object;

a light source for emitting light having a single frequency;

illuminating means for projecting the light of said light source onto said diffraction grating so that said diffraction grating produces one of first and second diffracted light beams of different diffraction orders and first and second diffracted light beams of the same diffraction order but of different signs;

a plurality of frequency modulators for performing frequency modulation of the first and second diffracted light beams from said diffraction grating and introducing aberration into the first and second diffracted light beams;

combining means for combining the first diffracted light beam subjected to frequency modulation by one of said frequency modulators, and a second diffracted light beam subjected to frequency modulation by one of the frequency modulators;

photoelectric conversion means for converting the light combined by said combining means into electrical signals comprising beat signals having an offset due to the aberration introduced by said plurality of frequency modulators; and a signal processing system for eliminating the offset and for detecting the position of said diffraction grating based on the phases of the electrical signals.

2. An apparatus according to claim 1, wherein the first diffracted light beam and the second diffracted light beam comprise diffracted light beams of the same order having different signs.

3. An apparatus according to claim 1, wherein the first diffracted light beam comprises a light beam whose frequency is increased by one of said frequency modulators, and a light beam whose frequency is reduced by another of the frequency modulators, each of which is combined with the second diffracted light beam by said combining means to produce two combined light beams, wherein said photoelectric conversion means individually converts the two combined light beams to two electrical signals, and wherein said signal processing system detects the position of said diffraction grating based on the phase difference between the electrical signals.

4. An apparatus according to claim 1, wherein each of said frequency modulators comprises an acoustooptical element.

5. An apparatus according to claim 1, further comprising an interference-fringe observing system for observing interference fringes generated by diffracted light beams having the same frequency and different diffraction orders produced by said diffraction grating.

6. A misalignment detection apparatus for detecting misalignment between a first diffraction grating and a second diffraction grating, said apparatus comprising:

a light source for emitting light having a single frequency;

illuminating means for projecting the light of the light source onto the first and second diffraction gratings so that the first diffraction grating produces one of first and second diffracted light beams of different diffraction orders and first and second light beams of the same diffraction order but of different signs and the second diffraction grating produces one of third and fourth diffracted light beams of different diffraction orders and third and fourth diffracted light beams of the same diffraction order but of different signs;

a plurality of frequency modulators for performing frequency modulation of the first, second, third, and fourth diffracted light beams from the first and second diffraction gratings and introducing aberration into the first and second, third, and fourth diffracted light beams;

a combined-light-forming optical system for forming a first combined light beam obtained by combining the first and second diffracted light beams each subjected to frequency modulation by one of said frequency modulators, and for forming a second combined light beam obtained by combining the third and fourth diffracted light beams each subjected to frequency modulation by another frequency modulator;

photoelectric conversion means for individually converting the first and second combined light beams from said combined-light forming optical system into two electrical signals each comprising beat signals having an offset due to the aberration introduced by said plurality of frequency modulators; and a signal processing system for eliminating the offset and for detecting misalignment between the first diffraction grating and the second diffraction grating based on the phase difference between the two electrical signals from the first and second combined light beams.

7. An apparatus according to claim 6, wherein the first diffracted light beam and the second diffracted light beam comprise diffracted light beams having the same diffraction order and different signs, wherein the third diffracted light beam and the first diffracted light beam have the same diffraction order, and wherein the fourth diffracted light beam and the second diffracted light beam have the same diffraction order.

8. An apparatus according to claim 6, wherein each of said frequency modulators comprises an acoustooptical element.

9. An apparatus according to claim 6, further comprising an interference-fringe observing system for observing interference fringes generated by diffracted light beams having the same frequency and different diffraction orders from the first and second diffraction gratings.

* * * * *

UNITED STATES PATENT AND TRADEMARK OFFICE
CERTIFICATE OF CORRECTION

PATENT NO. : 5,559,598
DATED : September 24, 1996
INVENTOR(S) : TAKAHIRO MATSUMOTO It is certified that error appears in the above-indentified patent and that said Letters Patent is hereby corrected as shown below:

ON THE COVER PAGE:

[57] ABSTRACT

Line 11, "modulaters," should read --modulators,--.

COLUMN 1

Line 4, "GRATINGS" should read --GRATING--.
    Line 20, "time mask (reticle) the" should read --the mask (reticle) onto the--.
    Line 30, "by," should read --by--.

COLUMN 3

Line 27, "or" should read --of--.

COLUMN 4

Line 7, "one the" should read --one of the--.
    Line 28, "art" should read --an--.

COLUMN 6

Line 26, "f1 (w1)." should read --f1 ($\omega$1).--.
    Line 32, "f2 (w2)." should read --f2 ($\omega$2).--.

UNITED STATES PATENT AND TRADEMARK OFFICE
CERTIFICATE OF CORRECTION

PATENT NO. : 5,559,598
DATED : September 24, 1996
INVENTOR(S) : TAKAHIRO MATSUMOTO It is certified that error appears in the above-indentified patent and that said Letters Patent is hereby corrected as shown below:

COLUMN 12

Line 55, "passing the" should read --passing through the--.

COLUMN 13

Line 33, "T$\Delta$x=4$\pi$x/p" should read --T$\Delta$x=4$\pi\Delta$x/p--.

COLUMN 14

Line 37, "(w1)." should read --($\omega$1).--.
Line 43, "f2 (w2)." should read --f2 ($\omega$2).--

COLUMN 17

Line 44, "respect," should read --respect--.

Signed and Sealed this

First Day of April, 1997

Attest:

BRUCE LEHMAN

Attesting Officer

Commissioner of Patents and Trademarks